United States Patent
Wan

(10) Patent No.: US 8,164,133 B2
(45) Date of Patent: Apr. 24, 2012

(54) VERTICAL TRANSISTOR AND METHOD OF ENABLING A VERTICAL TRANSISTOR TO GENERATE AN ALTERNATING CURRENT OUTPUT

(75) Inventor: Yue-Min Wan, Kaohsiung County (TW)

(73) Assignee: I Shou University, Kaohsiung County (TW)

( * ) Notice: Subject to any disclaimer, the term of this patent is extended or adjusted under 35 U.S.C. 154(b) by 97 days.

(21) Appl. No.: 12/831,605

(22) Filed: Jul. 7, 2010

(65) Prior Publication Data
US 2011/0210768 A1 Sep. 1, 2011

(51) Int. Cl.
*H01L 27/108* (2006.01)

(52) U.S. Cl. .................. 257/302; 257/334; 257/E21.41; 257/E27.096; 257/E29.262; 438/242; 327/129

(58) Field of Classification Search .................. 257/302, 257/334, E21.41, E27.096, E29.262; 438/242; 327/129
See application file for complete search history.

(56) References Cited

U.S. PATENT DOCUMENTS
6,864,736 B2 * 3/2005 Guedon et al. ................ 327/333
7,595,669 B2 * 9/2009 Curl et al. ..................... 327/129

OTHER PUBLICATIONS

Wan, Yue-Min et al., "Vibrations and Mechanically-Induced Currents in Nanopillars Transistor", Proceedings of the 3rd IEEE Int. Conf. on Nano/Micro Engineered and Molecular Systems, Jan. 6-9, 2008, Sanya, China.

* cited by examiner

*Primary Examiner* — Andy Huynh
(74) *Attorney, Agent, or Firm* — Snyder, Clark, Lesch & Chung, LLP

(57) ABSTRACT

A vertical transistor includes a gate isolating layer flanking a stack of a source layer, a resilient active unit and a drain layer, and a gate layer formed on the gate isolating layer. The active unit includes an active layer formed between first and second barrier layers each having a thickness ranging from 4 nm to 40 nm. When an input voltage including a DC component and a ripple component is applied to the source layer, the active unit periodically vibrates as a result of the ripple component of the input voltage such that an induced AC current is generated based on a control voltage applied to the gate layer to flow to the drain layer. The induced AC current flowing to the drain layer serves as an AC output generated by the vertical transistor based on the input voltage. A method of enabling a vertical transistor to generate an AC output is also disclosed.

14 Claims, 6 Drawing Sheets

VERTICAL TRANSISTOR AND METHOD OF ENABLING A VERTICAL TRANSISTOR TO GENERATE AN ALTERNATING CURRENT OUTPUT

BACKGROUND OF THE INVENTION

1. Field of the Invention

The invention relates to a vertical transistor, and more particularly to a vertical transistor capable of generating an alternating current output.

2. Description of the Related Art

FIG. 1 illustrates a conventional vertical metal oxidation semiconductor field effect transistor (MOSFET) 1 that includes a substrate 11, a gate oxidation layer 12, and a gate layer 13 formed on the gate oxidation layer 12. The substrate 11 has a drain layer 111, and a protrusion 112 projecting from the drain layer 111. The protrusion 112 has a top surface 113, opposite first and second side surfaces 114, 115, a first source section 116 formed between the top surface 113 and the first side surface 114, and a second source section 117 formed between the top surface 113 and the second side surface 115. The gate oxidation layer 12 is formed on the first and second side surfaces 114, 115 of the protrusion 112, and on a part of the drain layer 111.

In operation, when a gate voltage is applied to the gate layer 13, a current channel 14 is formed in the protrusion 112 such that currents from the first and second source sections 116, 117 flow to the drain layer 111 through the current channel 14. In this case, the current channel 14 is controlled by an electric field applied to the gate layer 13 that is similar to a traditional MOSFET.

However, the conventional vertical MOSFET 1 generates a digital output. When the conventional vertical MOSFET 1 is required to output an AC analog output, an additional digital-to-analog converter is required, thereby increasing costs. Furthermore, the conventional vertical MOSFET 1 has limited applicability.

SUMMARY OF THE INVENTION

Therefore, an object of the present invention is to provide a vertical transistor and method of enabling a vertical transistor to generate an alternating current output that can overcome the aforesaid disadvantages of the prior art.

According to one aspect of the present invention, there is provided a vertical transistor capable of generating an alternating current (AC) output based on an input voltage that includes a direct current (DC) component and a ripple component. The vertical transistor comprises:

a source layer adapted to receive the input voltage;

a drain layer opposite to the source layer in a first direction;

a resilient active unit formed between the source layer and the drain layer, and including an active layer, a first barrier layer formed between the active layer and the source, and a second barrier layer formed between the active layer and the drain layer, each of the first and second barrier layers being made of silicon nitride and having a thickness ranging from 4 nm to 40 nm;

a gate isolating layer flanking an assembly of the source layer, the drain layer and the active unit; and a gate layer formed on the gate isolating layer, opposite to the assembly of the source layer, the drain layer and the active unit in a second direction transverse to the first direction, and adapted to receive an external control voltage.

When the input voltage is applied to the source layer, the active unit periodically vibrates as a result of the ripple component of the input voltage such that an induced AC current is generated based on the control voltage applied to the gate layer to flow to the drain layer. The induced AC current flowing to the drain layer serves as the AC output.

According to another aspect of the present invention, there is provided a method of enabling a vertical transistor to generate an alternating current (AC) output. The vertical transistor includes a stack of a source layer, a resilient active unit and a drain layer, a gate isolating layer flanking the stack of the source layer, the drain layer and the active unit, and a gate layer formed on said gate isolating layer and opposite to the stack of the source layer, the active unit and the drain layer. The method comprises the steps of:

a) applying an input voltage that includes a direct current (DC) component and a ripple component to the source layer of the vertical transistor such that the active unit periodically vibrates as a result of the ripple of the input voltage applied to the source layer of the vertical transistor;

b) applying a control voltage to the gate layer of the vertical transistor; and c) adjusting the control voltage to obtain an induced AC current flowing to the drain layer of the vertical transistor, the induced AC current corresponding to the control voltage and serving as the AC output.

BRIEF DESCRIPTION OF THE DRAWINGS

Other features and advantages of the present invention will be come apparent in the following detailed description of the preferred embodiment with reference to the accompanying drawings, of which.

DETAILED DESCRIPTION OF THE PREFERRED EMBODIMENT

Figure 1:
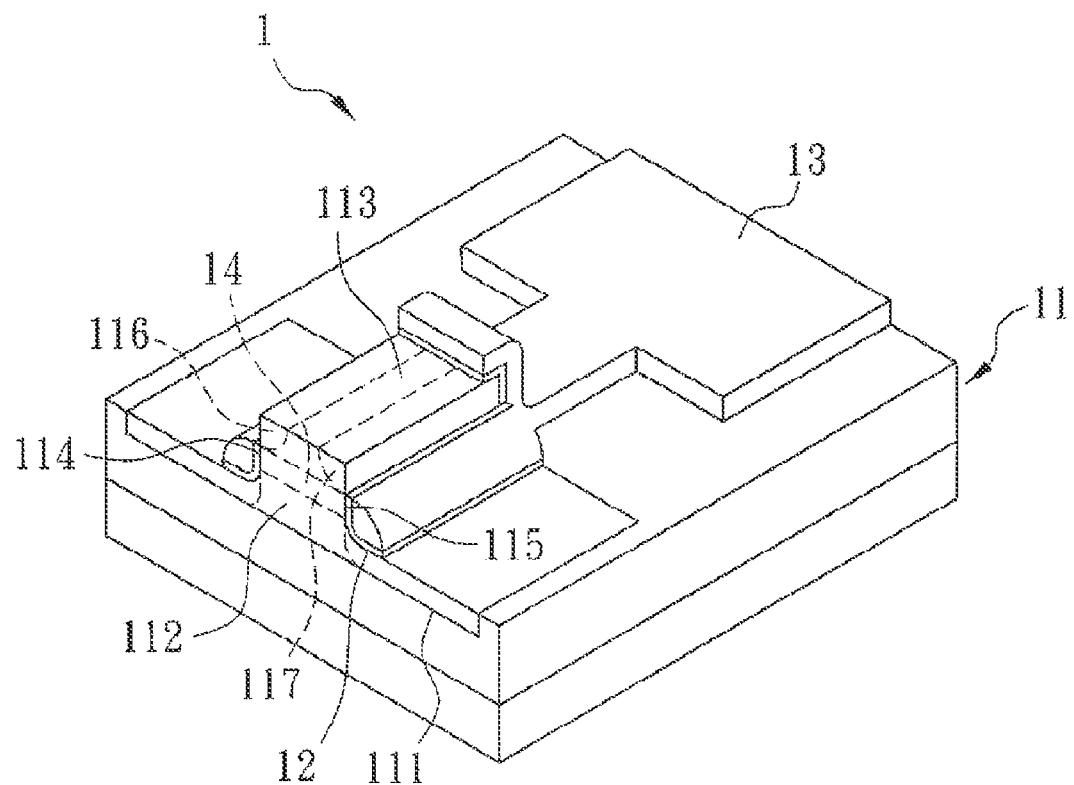
FIG. 1 is a perspective view of a conventional vertical transistor.
Figure 2:
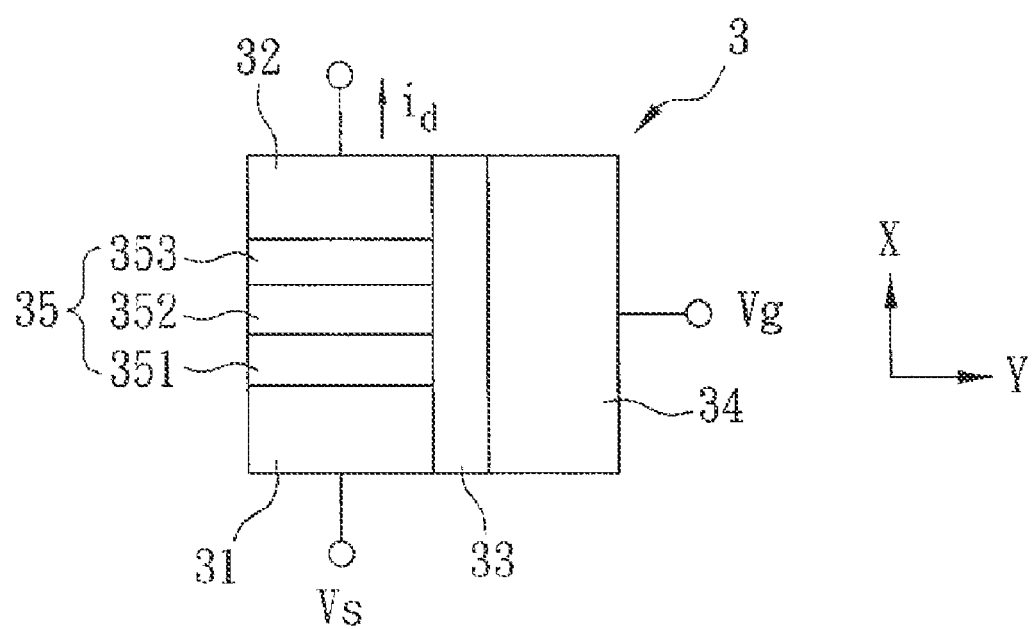
FIG. 2 is a schematic side view showing the preferred embodiment of a vertical transistor according to the present invention.

Referring to FIG. 2, the preferred embodiment of a vertical transistor 3 according to the present invention is shown to include a source layer 31, a drain layer 32, an active unit 35, a gate isolating layer 33, and a gate layer 34.

The source layer 31 is adapted to receive an input voltage (Vs). The input voltage (Vs) includes a direct current (DC) component and a ripple component. In this embodiment, the DC component is gradually increased, and the ripple component is in the form of square waves, and has a frequency ranging from $10^2$ Hz to $10^8$ Hz. In other embodiments, the ripple component can be in the form of triangular waves. In addition, the source layer 31 is an N-type polysilicon layer with carrier concentration of $10^{15} \sim 10^{22}$ cm$^{-3}$, and has a thickness of 200 nm.

The drain layer 32 is opposite to the source layer 31 in a first direction (X). In this embodiment, the drain layer 32 is an N-type polysilicon layer with carrier concentration of $10^{15} \sim 10^{22}$ cm$^{-3}$, and has a thickness of 200 nm.

The active unit 35 is formed between the source layer 31 and the drain layer 32, and includes an active layer 352, a first barrier layer 351 formed between the active layer 352 and the source layer 31, and a second barrier layer 353 formed between the active layer 352 and the drain layer 32. Each of the first and second barrier layers 351, 353 is made of silicon nitride (SiNx), and has a thickness ranging from 4 nm to 40 nm. The active layer 352 is a polysilicon layer and has a thickness ranging from 1 nm to 10 µm. In this embodiment, for example, the thickness of each of the first and second barrier layers 351, 353 is 4 nm, and the thickness of the active layer 352 is 3 nm.

The gate isolating layer 33 flanks an assembly of the source layer 31, the active unit 35 and the drain layer 32. In this embodiment, the gate isolating layer 33 has a thickness of 4 nm.

The gate layer 34 is formed on the gate isolating layer 33 and is opposite to the assembly of the source layer 31, the active unit 35 and the drain layer 32. The gate layer 34 is adapted to receive an external control voltage (Vg).

Figure 3:
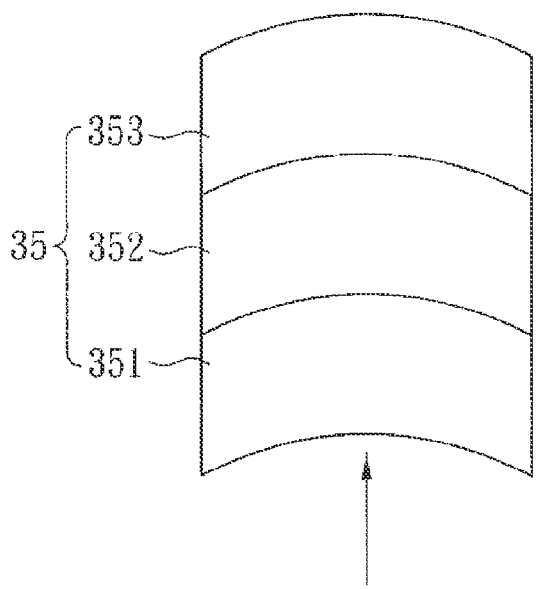
FIG. 3 is a schematic view illustrating upward deformation of an active unit of the preferred embodiment.
Figure 4:
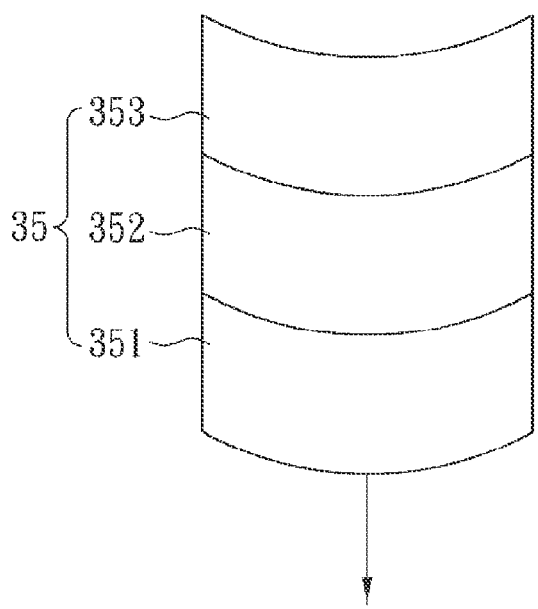
FIG. 4 is a schematic view illustrating downward deformation of the active unit of the preferred embodiment.

When the input voltage (Vs) is applied to the source layer 31, the active unit 35 periodically vibrates as a result of the ripple component of the input voltage (Vs), as shown in FIGS. 3 and 4, such that an induced AC current ($i_d$) is generated based on the control voltage (Vg) applied to the gate layer 34 to flow to the drain layer 32. The induced AC current ($i_d$) flowing to the drain layer 32 serves as the AC output. The induced AC current ($i_d$) associated with vibration of the active unit 35 has been proposed in an article by Yue-Min Wan, et al., entitled "Vibrations and Mechanically-induced Currents in Nanopillars Transistor", Proceedings of the 3$^{rd}$ IEEE Int. Conf. On Nana/Micro Engineered and Molecular Systems, 2008.

Figure 5:
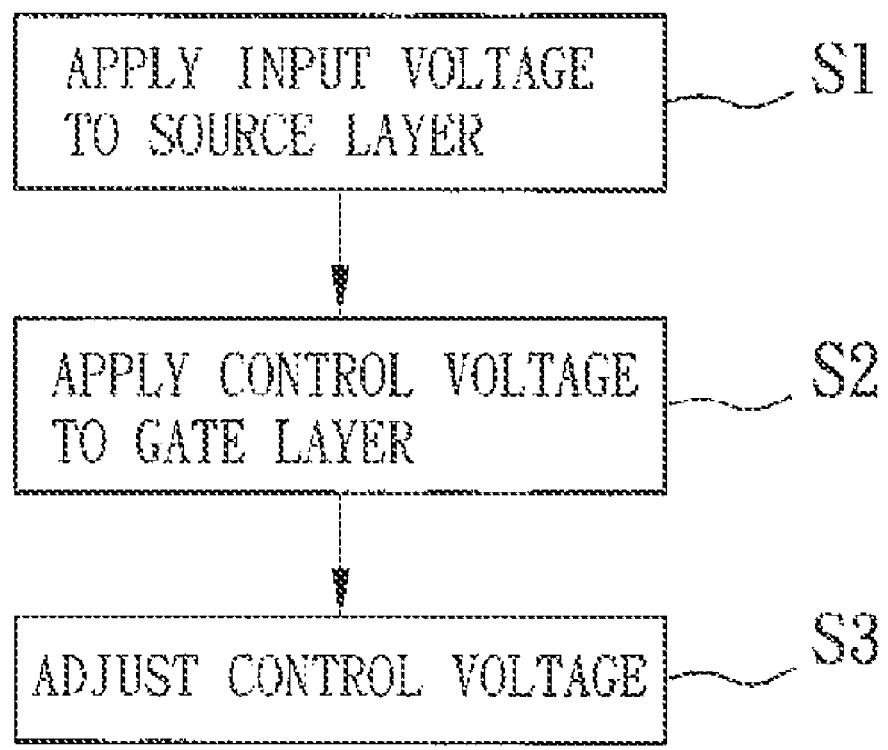
FIG. 5 is a flow chart of a method of enabling the vertical transistor of the preferred embodiment to generate an AC output.

FIG. 5 is a flow chart of a method of enabling the vertical transistor 3 of the preferred embodiment to generate an AC output.

In step S1, the input voltage (Vs) is applied to the source layer 31 of the vertical transistor 3.

In step S2, the control voltage (Vg) is applied to the gate layer 34 such that the active unit 35 periodically vibrates to generate an induced AC current ($i_d$) to flow to the drain layer 32.

In step S3, the control voltage (Vg) is adjusted to control the induced AC current ($i_d$) flowing to the drain layer 32 such that the induced AC current ($i_d$) corresponds to the control voltage (Vg) and serves as the AC output.

Figure 6:
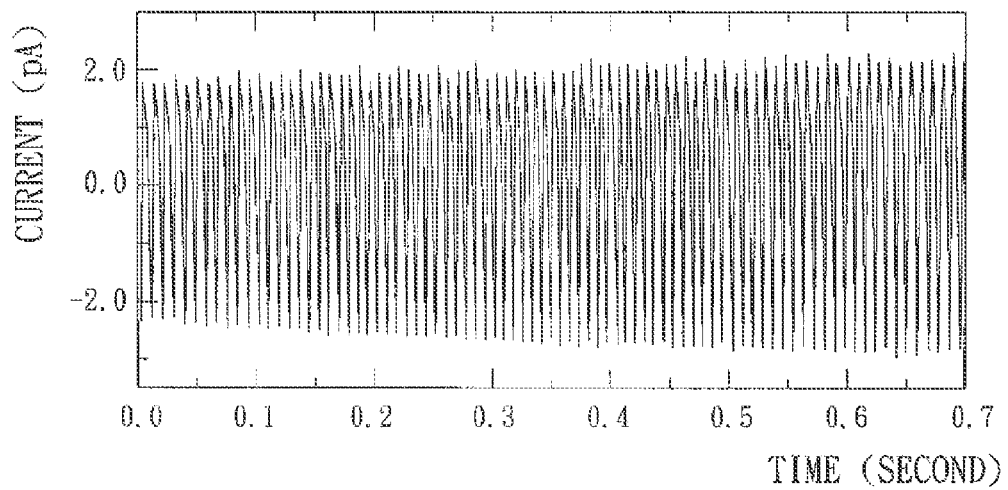
FIG. 6 is a plot illustrating an experimental result of an AC output generated by the preferred embodiment when a control voltage ranges from 0 V to 10 mV.
Figure 7:
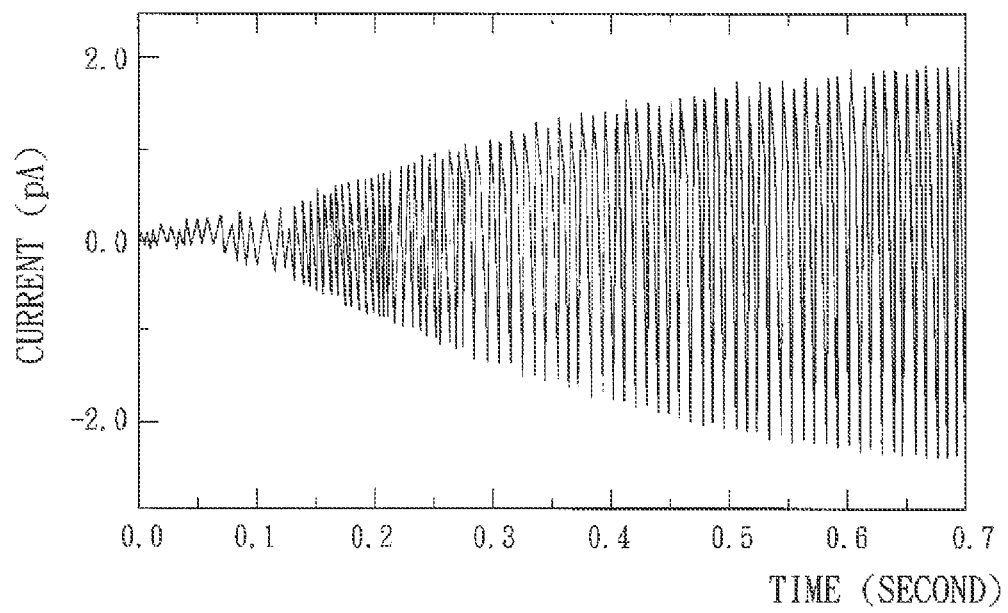
FIG. 7 is a plot illustrating an experimental result of the AC output generated by the preferred embodiment when the control voltage ranges from 40 mV to 60 mV.
Figure 8:
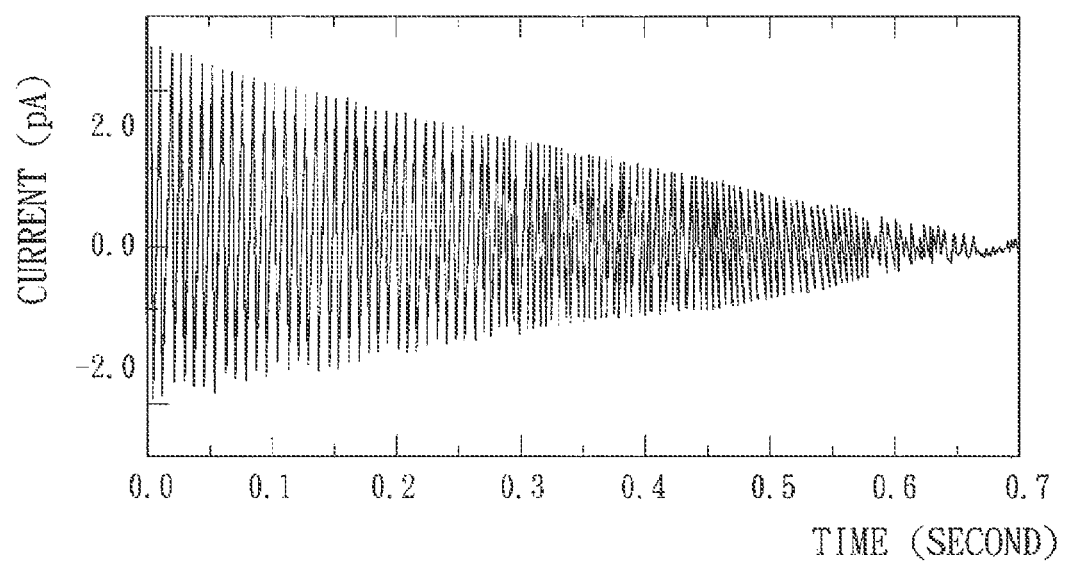
FIG. 8 is a plot illustrating an experimental result of the AC output generated by the preferred embodiment when the control voltage ranges from 90 mV to 110 mV.

FIGS. 6 to 8 illustrate experimental results of the AC output generated by the vertical transistor 3 through adjustment of the control voltage (Vg).

As shown in FIG. 6, when the control voltage (Vg) is adjusted to a value within a range from 0V to 10 mV, the AC output generated by the vertical transistor 3 has an amplitude with slight variations. In this case, the vertical transistor 3 of the present invention can be embodied as an adjustable high frequency signal generator.

As shown in FIG. 7, when the control voltage (Vg) is adjusted to a value within a range from 40 mV to 60 mV, the AC output generated by the vertical transistor 3 has an amplitude that gradually increases. In this case, the vertical transistor 3 of the present invention can be embodied as an AC signal amplifier.

As shown in FIG. 8, when the control voltage (Vg) is adjusted to a value within a range from 90 mV to 110 mV, the AC output generated by the vertical transistor 3 has an amplitude that gradually decreases. In this case, the vertical transistor 3 of the present invention can be embodied as an AC signal attenuator or a filter.

In sum, the vertical transistor 3 of the present invention is capable of generating an AC output based on the input voltage, such as a DC voltage, without requiring additional digital-to-analog converter, thereby resulting in a relatively low cost. Furthermore, the AC output generated by the vertical transistor 3 can be selected by adjusting the control voltage (Vg), thereby enhancing applicability.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A vertical transistor capable of generating an alternating current (AC) output based on an input voltage that includes a direct current (DC) component and a ripple component, said vertical transistor comprising:
   a source layer adapted to be applied with the input voltage;
   a drain layer opposite to said source layer in a first direction;
   a resilient active unit formed between said source layer and said drain layer, and including an active layer, a first barrier layer formed between said active layer and said source, and a second barrier layer formed between said active layer and said drain layer, each of said first and second barrier layers being made of silicon nitride and having a thickness ranging from 4 nm to 40 nm;
   a gate isolating layer flanking an assembly of said source layer, said active unit and said drain layer; and
   a gate layer formed on said gate isolating layer, opposite to said assembly of said source layer, said drain layer and said active unit in a second direction transverse to the first direction, and adapted to be applied with an external control voltage;
   wherein, when the input voltage is applied to said source layer, said active unit periodically vibrates as a result of the ripple component of the input voltage such that an AC current is generated based on the control voltage applied to said gate layer to flow to said drain layer, the AC current flowing to the said drain layer serving as the AC output.

2. The vertical transistor as claimed in claim 1, the DC component of the input voltage being gradually increased, wherein the AC output has an amplitude corresponding to that of the AC component of the input voltage when the control voltage ranges from 0 V to 10 mV.

3. The vertical transistor as claimed in claim 2, wherein the AC output has a gradually increased amplitude when the control voltage ranges from 40 mV to 60 mV.

4. The vertical transistor as claimed in claim 2, wherein the AC output has a gradually decreased amplitude when the control voltage ranges from 90 mV to 110 mV.

5. The vertical transistor as claimed in claim 1, wherein said active layer of said active unit is made of polysilicon, and has a thickness ranging from 1 nm to 10 µm.

6. The vertical transistor as claimed in claim 1, wherein said gate isolating layer is made of silicon oxide, and has a thickness less than 20 nm.

7. The vertical transistor as claimed in claim 1, wherein said source layer is an N-type polysilicon layer with carrier concentration of $10^{15}$~$10^{22}$ cm$^{-3}$.

8. The vertical transistor as claimed in claim 1, wherein said drain layer is an N-type polysilicon layer with carrier concentration of $10^{15}$~$10^{22}$ cm$^{-3}$.

9. A method of enabling a vertical transistor to generate an alternating current (AC) output, the vertical transistor including a stack of a source layer, a resilient active unit and a drain layer, a gate isolating layer flanking the stack of the source layer, the drain layer and the active unit, and a gate layer formed on the gate isolating layer and opposite to the stack of the source layer, the active unit and the drain layer, said method comprising the steps of:
   a) applying an input voltage that includes a direct current (DC) component and a ripple component to the source layer of the vertical transistor such that the active unit periodically vibrates as a result of the ripple component of the input voltage;
   b) applying a control voltage to the gate layer of the vertical transistor; and
   c) adjusting the control voltage to obtain an AC current flowing to the drain layer of the vertical transistor, the AC current corresponding to the control voltage and serving as the AC output.

10. The method as claimed in claim 9, wherein, in step a), the DC component of the input voltage is gradually increased.

11. The method as claimed in claim 10, wherein, in step c), when the control voltage is adjusted to a value within a range from 0 V to 10 mV, the AC output has an amplitude with slight variations.

12. The method as claimed in claim 10, wherein, in step c), when the control voltage is adjusted to a value within a range from 40 mV to 60 mV, the AC output has an amplitude that gradually increases.

13. The method as claimed in claim 10, wherein, in step c) when the control voltage is adjusted to a value within a range from 90 V to 110 mV, the AC output has an amplitude that gradually decreases.

14. The method as claimed in claim 9, in step a), the ripple component of the input voltage is in the form of square waves, and has a frequency ranging from $10^2$ Hz to $10^8$ Hz.

\* \* \* \* \*